(12) United States Patent
Toshifumi et al.

(10) Patent No.: US 8,721,950 B2
(45) Date of Patent: May 13, 2014

(54) RESIN FOR THERMAL IMPRINT

(71) Applicants: Scivax Corporation, Kanagawa (JP); Maruzen Petrochemical Co., Ltd., Tokyo (JP)

(72) Inventors: Takemori Toshifumi, Chiba (JP); Yoshiaki Takaya, Chiba (JP); Takahito Mita, Chiba (JP); Tetsuya Iizuka, Chiba (JP); Yuji Hashima, Chiba (JP); Takahisa Kusuura, Tokyo (JP); Mitsuru Fujii, Tokyo (JP); Takuji Taguchi, Tokyo (JP); Anupam Mitra, Tokyo (JP)

(73) Assignees: Scivax Corporation, Tokyo (JP); Maruzen Petrochemical Co., Ltd., Tokyo (JP)

( * ) Notice: Subject to any disclaimer, the term of this patent is extended or adjusted under 35 U.S.C. 154(b) by 0 days.

(21) Appl. No.: 13/666,339

(22) Filed: Nov. 1, 2012

(65) Prior Publication Data

US 2013/0056906 A1 Mar. 7, 2013

Related U.S. Application Data

(62) Division of application No. 11/992,625, filed as application No. PCT/JP2006/316772 on Aug. 25, 2006, now Pat. No. 8,324,332.

(30) Foreign Application Priority Data

Sep. 27, 2005 (JP) ................................. 2005-357014

(51) Int. Cl.
*B29C 59/02* (2006.01)
*C08G 61/08* (2006.01)
*C08F 8/04* (2006.01)
*C08F 32/08* (2006.01)

(52) U.S. Cl.
USPC ............ 264/293; 526/281; 525/338; 977/788

(58) Field of Classification Search
USPC ............ 264/293; 526/281; 525/338; 977/788
See application file for complete search history.

(56) References Cited

U.S. PATENT DOCUMENTS 4,992,511 A * 2/1991 Yamamoto et al. ............. 525/97
8,324,332 B2 * 12/2012 Toshifumi et al. ............ 526/281
2004/0126538 A1 * 7/2004 Corcoran et al. ............ 428/131

FOREIGN PATENT DOCUMENTS

EP 0800914 A1 * 10/1997

OTHER PUBLICATIONS

Throne, Encyclopedia of Polymer Science and Technology: Thermoforming, 2003, pp. 222-251.*
Monkkonen, et al, "Replication of an antireflecting element in COC plastics using a hot embossing technique," J. Mater. Chem., 2000, 10, 2634-2636.*

* cited by examiner

*Primary Examiner* — Fred M Teskin
(74) *Attorney, Agent, or Firm* — Factor Intellectual Property Law Group, Ltd.

(57) ABSTRACT

A resin for thermal imprint include a cyclic-olefin-based thermoplastic resin that contains at least one of skeletons represented by the following chemical equation 1 or the following chemical equation 2 in a main chain. The glass transition temperature Tg (° C.) and the value ([M]) of MFR at 260° C. satisfy the following equation 1, and [M]>10. The thermal imprint characteristics (transferability, mold release characteristic, and the like) are superior and the productivity (throughput) is improved.

[Chemical Equation 1]

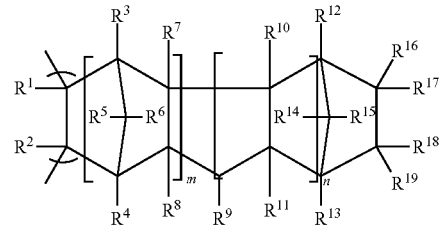

[Chemical Equation 2]

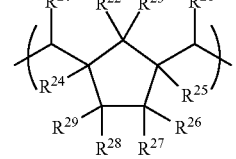

$Tg(° C.) < 219 \times \log[M] - 104$ [Equation 1]

8 Claims, No Drawings

RESIN FOR THERMAL IMPRINT

RELATED APPLICATIONS

This application is a divisional of U.S. application Ser. No. 11/992,625 filed on Sep. 4, 2009, which is a national phase of PCT Patent Application No. PCT/JP2006/316772, filed Aug. 25, 2006 which claims the benefit of Japanese Patent Application No. 2005-280802, filed Sep. 27, 2005; all the contents of which are incorporated herein by reference.

TECHNICAL FIELD

The present invention relates to a resin for thermal imprint. More specifically, the present invention relates to a cyclic-olefin-based thermoplastic resin which has a specific correlation between a glass transition temperature Tg (° C.) and MFR at 260° C., and can be used for producing an injection molded body.

BACKGROUND ART

As the optical fields for optical communications, optical disks, displays, optical sensors, and the like dramatically develop, achieving both performance and cost becomes important for optical resin materials. Expectations for transparent resin materials which are easy to process become large in fields of biochips, micro reactors, and the like, in lieu of glasses. In all fields, processing of a base material surface, in particular, microprocessing becomes requisite, and the microprocessing becomes an important technology in a recent semiconductor field where integration becomes remarkable. Conventionally, to form a minute pattern on the surface of a transparent material, schemes of cutting the surface mechanically or of printing a pattern using a resist, a thermo, ultraviolet, or electron radiation curing resin, or the like are used.

According to the mechanical cutting, however, there is a problem such that an advanced and complex processing technique is required. According to the pattern printing using a resist or the like, steps thereof are complicated, and there is a problem in the durability, such as peeling of a printed pattern. Further, as patterns become minuter, a mechanism which controls a whole process highly precisely becomes requisite, so that the cost issue becomes not negligible.

To cope with such problems, there is proposed a thermal imprint method for forming a minute pattern at low cost. That is, this is a method of pressing a mold, having a minute pattern heated more than or equal to a glass transition temperature of a resin, against a resin substrate, and of transferring the minute pattern of the mold on the melted resin surface.

Disclosed so far to improve the thermal imprint characteristics (transferability, mold release characteristic, and the like) and the productivity (throughput) are a scheme of providing an insulator to shorten a cycle of temperature rising and cooling (see, for example, Japanese Unexamined Patent Application Laid-open Publication No. 2002-361500), and a scheme of providing an ultrasonic generation mechanism to reduce the melt viscosity by ultrasonic (see, for example, Japanese Unexamined Patent Application Laid-open Publication No. 2004-288811). However, there are few literatures which mentioned materials used for thermal imprint, and development of the materials for thermal imprint is desired.

In general, examples of materials used for thermal imprint are resin materials, glasses, metals, and the like. The resin materials can be molded at a lower temperature in comparison with imprinting to metals or glasses, thus advantageous for the manufacturing cost.

An example of resins is a (meta) acrylic resin represented by polymethacrylic acid (PMMA) or a polycarbonate resin, but have a problem such that the heat resistance is low and size distortion occurs due to water absorption. Further, controlling a balance between the fluidity and the solidification is difficult, so that it is difficult to maintain and use a minutely-transferred pattern (see, for example, Japanese Unexamined Patent Application Laid-open Publication No. 2000-158532).

On the other hand, as a resin having both heat resistance and dimension stability originating from the low water absorption coefficient, there are cyclic-olefin-based thermoplastic resins. In general, the cyclic-olefin-based thermoplastic resins are superior in the transparency, the chemical resistance property, and the low moisture absorption characteristic, and its heat resistance can be easily controlled by the structure of the cyclic-olefin or the contained amount of the cyclic-olefin in the resin. The resin has a low viscosity, and a short relaxation time (time necessary for filling the resin in the pattern of a mold), and is less adhered to the mold, and is superior in the transfer accuracy of a minute pattern, so that application as a thermal imprint material is expected as having a good productivity (see, for example, J. Mater. Chem., 2000, volume 10, page 2634).

SUMMARY OF THE INVENTION

Problems to be Solved by the Invention

However, conventional cyclic-olefin-based thermoplastic resins are not ones that the resin properties, such as a glass transition temperature Tg (° C.) and the fluidity are developed for the process of thermal nano-imprint, but require a high molding temperature and a large molding pressure, thus having insufficient thermal imprint characteristics (transferability, mold release characteristic, and the like). Moreover, a long molding time is required, so that the productivity (throughput) is low. For example, one disclosed in the foregoing non-patent literature 1 has a high molding temperature of 240° C., so that it takes a time to cool it down after the pattern of a mold is transferred, and the productivity (throughput) for manufacturing imprint products becomes low. This is primarily because that a correlation between the resin properties, in particular, a glass transition temperature and MFR which becomes the barometer of the fluidity of the resin, and a correlation between an imprint conditions (molding temperature, molding pressure, mold release temperature, and the like) to the resin and the imprint characteristics (transferability, mold release characteristic, and the like) are not figured out.

Therefore, it is an object of the invention to provide a cyclic-olefin-based thermoplastic resin which can be used for manufacturing an injection molded body like a substrate used for thermal imprint, is superior in thermal imprint characteristics (transferability, mold release characteristic, and the like), and improves a productivity (throughput), and a thermal imprint method using the same.

Means for Solving the Problems

To achieve the object, a cyclic-olefin-based thermoplastic resin of the invention is used for producing an injection molded body, contains at least one of skeletons represented by the following chemical equation 11 or the following chemical equation 12 in a main chain, and wherein a glass transition temperature Tg (° C.) of the resin and a value ([M]) of MFR at 260° C. satisfy the following equation 1, and [M]>10.

[Chemical Equation 11]

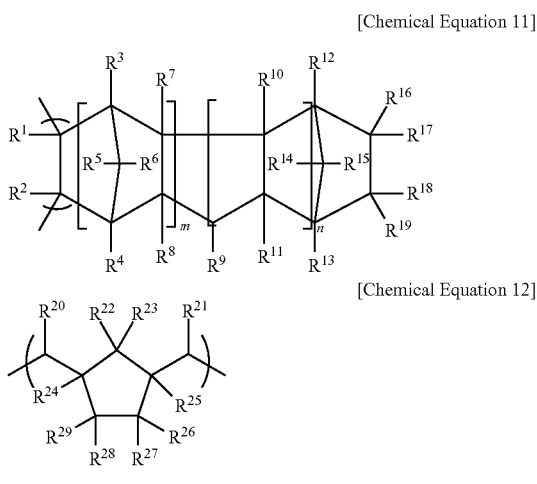

$Tg(° C.) < 219 \times \log [M] - 104$      [Equation 1]

($R^1$ to $R^{29}$ in the chemical equations 11, 12 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

Another resin for thermal imprint of the invention is used for producing an injection molded body, comprises a cyclic-olefin-based thermoplastic resin that contains at least one of skeletons represented by the following chemical equation 13 or the following chemical equation 14 in a main chain, and wherein a glass transition temperature Tg (° C.) of the resin and a value ([M]) of MFR at 260° C. satisfy a following equation 1, and [M]>20 and Tg>90° C.

[Chemical Equation 13]

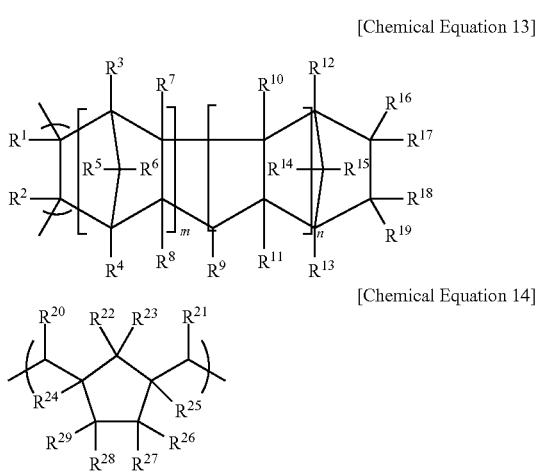

[Chemical Equation 14]

$Tg(° C.) < 219 \times \log [M] - 104$      [Equation 1]

($R^1$ to $R^{29}$ in the chemical equations 13, 14 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

In this case, it is preferable that the cyclic-olefin-based thermoplastic resin should comprise a copolymer of cyclic-olefin represented by the following chemical equation 15 and α-olefin, or a polymer produced by hydrogenation after ring-opening polymerization of the cyclic-olefin.

[Chemical Equation 5]

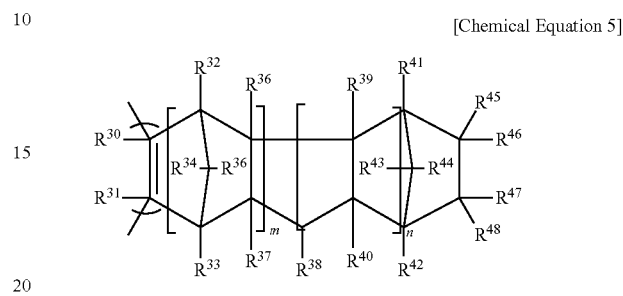

($R^{30}$ to $R^{48}$ in chemical equation 15 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0)

The resin for thermal imprint may contain greater than or equal to one additive. In this case, it is preferable that the additive should contain at least either one of an anti-oxidizing agent or a lubricant.

Further, it is preferable that a resin containing a skeleton represented by the chemical equation 13 is a copolymer of cyclic-olefin represented by the following chemical equation 16 and ethylene.

[Chemical Equation 6]

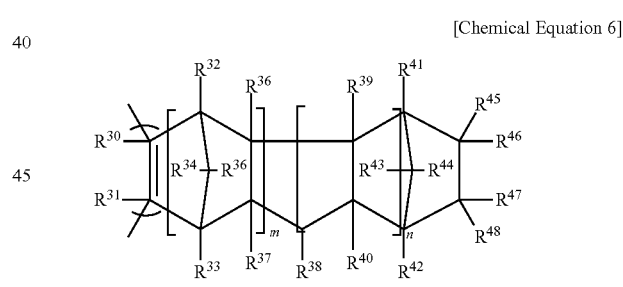

($R^{30}$ to $R^{48}$ in the chemical equation 16 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0)

A thermal imprint method of the invention comprises: pressing a mold, which is heated to less than or equal to a glass transition temperature Tg (° C.) of a resin for thermal imprint +45° C., against an injection molded body comprising the foregoing resin for thermal imprint, thereby transferring a pattern of the mold.

Another thermal imprint method of the invention comprises steps of: pressing a mold against an injection molded body comprising the foregoing resin for thermal imprint; and releasing the mold from the resin for thermal imprint at a temperature greater than or equal to a glass transition temperature (Tg) of the resin for thermal imprint −25° C.

Other thermal imprint method of the invention comprises: pressing a mold against an injection molded body comprising the foregoing resin for thermal imprint at less than or equal to 1.2 MPa, thereby transferring a pattern of the mold.

The invention relates to a method of using a cyclic-olefin-based thermoplastic resin for an imprint process, the resin is used for producing an injection molded body, and contains at least one of skeletons represented by the following chemical equation 17 or the following chemical equation 18 in a main chain, and wherein a glass transition temperature Tg (° C.) of the resin and a value ([M]) of MFR at 260° C. satisfy a following equation 1, and [M]>10.

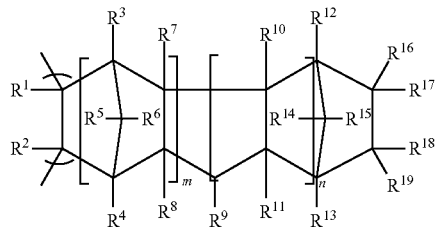

[Chemical Equation 7]

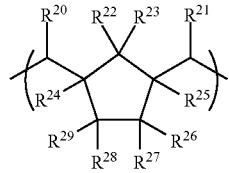

[Chemical Equation 8]

$$Tg(° C.) < 219 \times \log [M] - 104 \quad \text{[Equation 1]}$$

($R^1$ to $R^{29}$ in the chemical equations 17, 18 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

The invention also relates to a method of using a cyclic-olefin-based thermoplastic resin for an imprint process, the resin is used for producing an injection molded body, and contains at least one of skeletons represented by the following chemical equation 19 or the following chemical equation 20 in a main chain, and wherein a glass transition temperature Tg (° C.) of the resin and a value ([M]) of MFR at 260° C. satisfy a following equation 1, and [M]>20 and Tg>90° C.

[Chemical Equation 9]

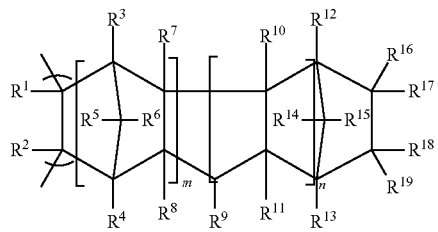

-continued

[Chemical Equation 10]

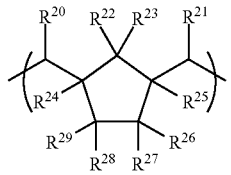

$$Tg(° C.) < 219 \times \log [M] - 104 \quad \text{[Equation 1]}$$

($R^1$ to $R^{29}$ in the chemical equations 19, 20 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

Effect of the Invention

Using a cyclic-olefin-based thermoplastic resin, which has a specific correlation between a glass transition temperature Tg (° C.) and MFR at 260° C., enables a thermal imprint at a low temperature and a low pressure, thereby improving the imprint characteristics (transferability, mold release characteristic, and the like) and the productivity (throughput).

Further, by applying imprint conditions (molding temperature, molding pressure, mold release temperature, and the like) to a cyclic-olefin-based thermoplastic resin having a specific correlation between a glass transition temperature Tg (° C.) and MFR at 260° C., the thermal imprint characteristics (transferability, mold release characteristic, and the like) and the productivity (throughput) can be further improved.

DETAILED DESCRIPTION OF THE INVENTION

While this invention is susceptible of embodiment in many different forms, there will herein be described in detail one or more embodiments with the understanding that the present disclosure is to be considered as an exemplification of the principles of the invention and is not intended to limit the invention to the embodiments illustrated.

A cyclic-olefin-based thermoplastic resin to which the invention is applied is a copolymer of cyclic-olefin and α-olefin, i.e., a copolymer with α-olefin containing a repeating unit indicated by a following chemical equation 21 and derived from cyclic-olefin, or a polymer that hydrogen is added to cyclic-olefin indicated by a chemical equation 22 undergone ring-opening polymerization.

[Chemical Equation 21]

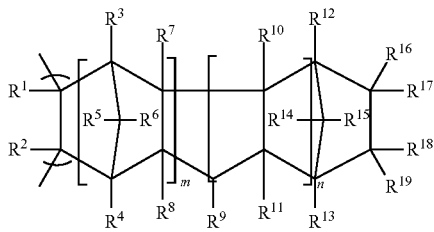

[Chemical Equation 22]

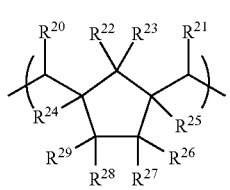

$R^1$ to $R^{29}$ in the chemical equation 21 and the chemical equation 22 may differ, or may be same, and each of which is a substituent containing hydrogen atoms, deuterium atoms, hydrocarbon radical having carbon number of 1 to 15, halogen atoms, or hetero atoms, such as oxygen, or sulfur, and forms a monocyclic or polycyclic structure with one another. Note that m and n are integers greater than or equal to zero.

Cyclic-olefin monomer which constitutes the foregoing resin has a structure indicated by a chemical equation 23, and examples of preferable monomer are, for example, bicyclo[2,2,1]hept-2-ene (norbornene), 5-methylbicyclo[2,2,1]hept-2-ene, 7-methybicyclo[2,2,1]hept-2-ene, 5-ethylbicyclo[2,2,1]hept-2-ene, 5-propylbicyclo[2,2,1]hept-2-ene, 5-n-butylbicyclo[2,2,1]hept-2-ene, 5-isobutylbicyclo[2,2,1]hept-2-ene, 1,4-dimethylbicyclo[2,2,1]hept-2-ene, 5-bromobicyclo[2,2,1]hept-2-ene, 5-chlorobicyclo[2,2,1]hept-2-ene, 5-fluorobicyclo[2,2,1]hept-2-ene, 5,6-dimethylbicyclo[2,2,1]hept-2-ene, dicyclopentadiene, tricyclopentadiene, tetracyclo[4,4,0,1$^{2.5}$,1$^{7.10}$]-3-dodecene, 5,10-dimethyltetracyclo[4,4,0,1$^{2.5}$,1$^{7.10}$]-3-dodecene, 2,10-dimethyltetracyclo[4,4,0,1$^{2.5}$,1$^{7.10}$]-3-dodecene, 11,12-dimethyltetracyclo[4,4,0,1$^{2.5}$,1$^{7.10}$]-3-dodecene, 2,7,9-trimethyltetracyclo[4,4,0,1$^{2.5}$,1$^{7.10}$]-3-dodecene, 9-ethyl-2,7-dimethyltetracyclo[4,4,0,1$^{2.5}$,1$^{7.10}$]-3-dodecene, 9-isobutyl-2,7-dimethyltetracyclo[4,4,0,1$^{2.5}$,1$^{7.10}$]-3-dodecene, 9-isobutyl-2,7-dimethyltetracyclo[4,4,0,1$^{2.5}$, 1$^{7.10}$]-3-dodecene, 9,11,12-trimethyltetracyclo[4,4,0,1$^{2.5}$, 1$^{7.10}$]-3-dodecene, 9-ethyl-11,12-dimethyltetracyclo[4,4,0, 1$^{2.5}$,1$^{7.10}$]-3-dodecene, 9-isobutyl-11,12-dimethyltetracyclo [4,4,0,1$^{2.5}$,1$^{7.10}$]-3-dodecene, 5,8,9,10-tetramethyltetracyclo [4,4,0,1$^{2.5}$,1$^{7.10}$]-3-dodecene, 8-hexyltetracyclo[4,4,0,1$^{2.5}$, 1$^{7.10}$]-3-dodecene, 8-stearyltetracyclo[4,4,0,1$^{2.5}$,1$^{7.10}$]-3-dodecene, 8-methyl-9-ethyltetracyclo[4,4,0,1$^{2.5}$,1$^{7.10}$]-3-dodecene, 8-cyclohexyltetracyclo[4,4,0,1$^{2.5}$, 1$^{7.10}$]-3-dodecene, 8-ethylidenetetracyclo[4,4,0,1$^{2.5}$,1$^{7.10}$]-3-dodecene, 8-chlorotetracyclo[4,4,0,1$^{2.5}$,1$^{7.10}$]-3-dodecene, 8-bromotetracyclo[4,4,0,1$^{2.5}$,1$^{7.10}$]-3-dodecene, 8-fluorotetracyclo[4,4,0,1$^{2.5}$,1$^{7.10}$]-3-dodecene, 8,9-dichlorotetracyclo [4,4,0,1$^{2.5}$, 1$^{7.10}$]-3-dodecene, hexacyclo[6,6,1,1$^{3.6}$,1$^{10.13}$, 0$^{2.7}$,0$^{9.14}$]-4-deptadecene, 12-methylhexacyclo[6,6,1,1$^{3.6}$, 1$^{10.13}$,0$^{2.7}$,0$^{9.14}$]-4-deptadecene, 12-ethylhexacyclo[6,6,1, 1$^{3.6}$,1$^{10.13}$,0$^{2.7}$,0$^{9.14}$]-4-deptadecene, 12-isobutylhexacyclo [6,6,1,1$^{3.6}$,1$^{10.13}$,0$^{2.7}$,0$^{9.14}$]-4-deptadecene, 1,6,10-trimethyl-12-isobutylhexacyclo[6,6,1,1$^{3.6}$,1$^{10.13}$,0$^{2.7}$,0$^{9.14}$]-4-deptadecene, 5-methyl-5-phenyl-bicyclo[2,2,1]hept-2-ene, 5-ethyl-5-phenyl-bicyclo[2,2,1]hept-2-ene, 5-n-propyl-5-phenyl-bicyclo[2,2,1]hept-2-ene, 5-n-butyl-5-phenyl-bicyclo[2,2,1]hept-2-ene, 5,6-dimethyl-5-phenyl-bicyclo[2, 2,1]hept-2-ene, 5-methyl-6-ethyl-5-phenylbicyclo[2,2,1] hept-2-ene, 5,6,6-trimethyl-5-phenyl-bicyclo[2,2,1]hept-2-ene, 1,4,5-trimethylbicyclo[2,2,1]hept-2-ene, 5,6-diethyl-5-phenylbicyclo[2,2,1]hept-2-ene, 5-bromo-5-phenyl-bicyclo [2,2,1]hept-2-ene, 5-chloro-5-phenyl-bicyclo[2,2,1]hept-2-ene, 5-fluoro-5-phenyl-bicyclo[2,2,1]hept-2-ene, 5-methyl-5-(tert-butylphenyl)-bicyclo[2,2,1]hept-2-ene, 5-methyl-5-(bromophenyl)-bicyclo[2,2,1]hept-2-ene, 5-methyl-5-(chlorophenyl)-bicyclo[2,2,1]hept-2-ene, 5-methyl-5-(fluorophenyl)-bicyclo[2,2,1]hept-2-ene, 5-methyl-5-(α-naphthyl)-bicyclo[2,2,1]hept-2-ene, 5-methyl-5-antracenyl-bicyclo[2,2,1]hept-2-ene, 8-methyl-8-phenyl-tetracyclo[4,4, 0,1$^{2.5}$,1$^{7.10}$]-3-dodecene, 8-ethyl-8-phenyl-tetracyclo[4,4,0, 1$^{2.5}$,1$^{7.10}$]-3-dodecene, 8-n-propyl-8-phenyl-tetracyclo[4,4, 0,1$^{2.5}$,1$^{7.10}$]-3-dodecene, 8-n-butyl-8-phenyl-tetracyclo[4,4, 0,1$^{2.5}$,1$^{7.10}$]-3-dodecene, 8-chloro-8-phenyl-tetracyclo[4,4, 0,1$^{2.5}$,1$^{7.10}$]-3-dodecene, 11-methyl-11-phenyl-hexacyclo[6, 6,1,1$^{3.6}$,1$^{10.13}$,0$^{2.7}$,0$^{9.14}$]-4-heptadecene, 1,4-methano-4a,9, 9-trimethyl-1,4,9a-trihydrofluorene. Such various monomers can be basically made by a thermal Diels-Alder reaction of corresponding dienes and olefins, and adding hydrogen or the like appropriately makes it possible to produce a desired monomer.

[Chemical Equation 23]

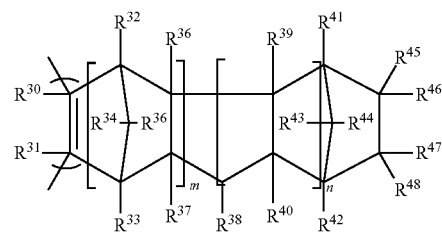

$R^{30}$ to $R^{48}$ the chemical equation 23 may differ or may be same, and each of which is a substituent including hydrogen atoms, deuterium atoms, hydrocarbon radical having carbon number of 1 to 15, halogen atoms, or hetero atoms, such as oxygen and sulfur, and forms a monocyclic or polycyclic structure with each other. Note that m and n are integers greater than or equal to zero.

An example of α-olefin suitably used for the copolymer indicated by the chemical equation 21 is α-olefin having a carbon number of 2 to 20, preferably, a carbon number of 2 to 10, and includes, for example, ethylene, propylene, 1-butene, 1-pentene, 3-methyl-1-butene, 3-methyl-1-pentene, 1-hexene, 1-octene, 1-decene, and those can be used individually or combined. Ethylene and propylene are preferable in those, and ethylene is particularly preferable from the standpoint of practical aspects, such as copolymer characteristic, and economic efficiency.

In the copolymer indicated by the chemical equation 21, the preferable mole ratio (α-olefin/cyclic-olefin) between the α-olefin and the cyclic-olefin is within a range from 10/90 to 90/10, and further preferably, with in a range from 30/70 to 70/30. The mole ratio in copolymer is decided based on $^{13}$C-NMR (400 MHz, temperature: 120° C./solvent: 1,2,4-trichlorobenzene/1,1,2,2-deuterated tetrachloroethane mixing system).

The thermal imprint resin of the invention is adjusted in such a way that the glass transition temperature Tg (° C.) thereof and a value ([M]) of MFR at 260° C. satisfy the following equation 1.

$$Tg(°C.)<219×\log[M]-104$$  [Equation 1]

The weight average molecular weight Mw of the cyclic-olefin-based thermoplastic resin indicated by the chemical equation 21 or the chemical equation 22 is within 10,000 to 1,000,000, preferably, 20,000 to 500,000, and further preferably, 50,000 to 200,000, and the value [M] of MFR at 260° C. is greater than or equal to 10, preferably, greater than or equal to 20, and further preferably, greater than or equal to 30. Accordingly, the fluidity of the resin becomes high, thus facilitating a filling of the resin in the pattern of a mold, so that the imprint characteristics (transferability, mold release characteristic, and the like) can be improved without deteriorating the resin property.

In considering the application of the resin on which a minute pattern is transferred by thermal imprint, it is preferable that the heat resistance of the resin should be high, and the glass transition temperature should be greater than or equal to 80° C., preferably, greater than or equal to 90° C., and further preferably, higher than the boiling temperature of water, i.e., beyond 100° C. in view of the practicality.

A polymerization method for producing the resin is not limited to any particular ones, and well-known methods, such as a method of coordination polymerization using Ziegler-Natta catalyst or single-site catalyst, and further, causing a copolymer to be subjected to hydrogen addition in accordance with necessity, and a method of adding hydrogen after ring-opening polymerization using metathesis polymerization catalyst. As a method of adding hydrogen, well-known methods can be employed, and this can be carried out using a catalyst containing metal components, such as nickel, and palladium. Examples of the single-site catalyst used for producing the copolymer indicated by, for example, the chemical equation 21 are various kinds of metallocene compounds, and methylene(cyclopentadienyl) (tetracyclopentadienyl)zirconiumdichloride or the like disclosed in, for example, Japanese Unexamined Patent Application Laid-open Publication No. 2003-82017 can be preferably used. A promoter used for a polymerization reaction is not limited to any particular one, but methyl aluminoxanes can be used preferably, and other organic aluminum compounds may coexist and polymerize in accordance with a reaction. Such a polymerization reaction can be preferably carried out within a range from a room temperature (25° C. or so) to 200° C., but it is desirable to carry out such a reaction within a range from 40 to 150° C. in view of the reactivity and the stability of a catalyst. An organic solvent used for a polymerization reaction is not limited to any particular one, and for example, aromatic solvents, such as benzene, toluene, xylene, and ethyl benzene, saturated hydrocarbon solvents, such as hexane, cyclohexane, heptane, methyl cyclohexane, and octane, or a mixed solvent thereof can be preferably used. After the resin is produced, hetero atoms, such as oxygen atoms and sulfur atoms can be arbitrarily introduced by a radical reaction.

In accordance with necessity, greater than or equal to one of additives, such as an anti-oxidizing agent, a heat resistance stabilizer, a weathering stabilizer, a light stabilizer, an anti-static agent, a slipping agent, anti-blocking agent, an anti-fog additive, a lubricant, a color, a pigment, a natural oil, a synthetic oil, and a wax, can be added and mixed, and the mix ratio thereof can be set arbitrarily. Additives (anti-oxidizing agent, lubricant, and the like) are not limited to any particular ones, and well-known compounds can be used preferably.

According to the invention, addition of an oxidizing agent prevents an oxidization of the resin when heated, a creation of a gel originating from the staining of the resin and a bridge formation of the resin molecular chain, and a deterioration of physical property due to a disconnection of the resin molecular chain.

According to the invention, addition of a lubricant improves the mold release characteristic, after imprint, and the productivity (throughput) of imprint products. Furthermore, there is an effectiveness such that the resin can be easily put into a pattern on a mold when fabricating the resin.

Further, without deteriorating the physical properties required in the application fields of an imprint product, a rubber component can be added to improve the durability of the resin plate, and a well-known compound can be used.

Examples of the applications of the imprint product are optical devices, such as an optical waveguide, a light guiding plate, and a diffraction grating, biochips, fluidic devices, such as a micro flow channel, and a micro reactor, media for saving data, and circuit substrates.

The method of manufacturing an injection molded body is not limited to any particular one, and a well-known method can be applied. The thickness can be arbitrarily selected in accordance with an application of an imprint product, and molding is possible if the thickness is greater than or equal to 300 μm. Preferably, the imprint product is suitable for an injection molded body having a thickness of greater than or equal to 500 μm, and more preferably, is suitable for an injection molded body having a thickness of greater than or equal to 1 mm, and further preferably, is suitable for an injection molded body having a thickness of greater than or equal to 2 mm. The injection molded body using the thermal imprint resin of the invention can be formed in any shapes, but for example, can be formed in an approximately planer shape as a substrate. In this case, it is preferable to make the flatness high as much as possible, and for example, it is preferable that it should be formed as to be less than or equal to, for example, 1 μm, more preferably, less than or equal to 100 nm, and further preferably, less than or equal to 10 nm, and still further preferably, less than or equal to 1 nm.

Various products can be used as a device for imprinting, and can be selected arbitrarily. Various sizes, such as less than or equal to 100 μm, less than or equal to 50 μm, less than or equal to 10 μm, less than or equal to 1 μm, and less than or equal to 500 nm can be selected as the size of a transferred pattern for the thermal imprint resin of the invention.

Next, an explanation will be given of a method of performing imprinting on an injection molded body comprising the resin of the invention.

To realize a process having the improved imprint characteristics (transferability, mold release characteristic, and the like), it is preferable to reduce a molding pressure and to shorten the retention time at molding. This is because that if the molding pressure when performing imprinting is too high and the retention time of a pressure is too long, the resin adheres to the mold, so that the pattern is elongated or damaged in mold releasing, and the transfer precision of the pattern is reduced. Specifically, in using an injection molded body of the resin of the invention, the molding pressure in performing imprinting should be less than or equal to 2.3 MPa, and more preferably, less than or equal to 1.2 MPa. Further, the retention time in performing molding should be less than or equal to 30 seconds, more preferably, less than or equal to 15 seconds.

Further, to realize a process having the improved productivity (throughput), it is preferable to reduce the temperature of the mold, and to shorten the retention time in performing molding. This is because that if the mold temperature is low, the cooling time can be shortened, and if the retention time at which the mold and the injection molded body are pressed is short, then the molding time can be shortened.

Specifically, it is preferable to use an injection molded body comprised of the resin of the invention, and to set the temperature in performing molding to less than or equal to the glass transition temperature Tg+60° C., and more preferably, less than or equal to Tg+45° C. It is preferable that the temperatures of the mold in mold releasing and the injection molded body should be greater than or equal to Tg−40° C., and more preferably, greater than or equal to Tg−25° C.

EXAMPLES

Examples of the invention will be explained below, but the invention should not be limited to the following examples.

Regarding the weight average molecular weight (Mw), the number average molecular weight (Mn), and the molecular weight fractionation (Mw/Mn) of the resin to be used, an GPC device manufactured by Wasters was used by the gel permeation chromatography method (GPC), and those were measured under a condition such that column. K-805L/K-806L manufactured by Shodex, column temperature: 40° C., solvent: chloroform, flow rate: 0.8 ml/minute. The glass transition temperature Tg (° C.) of the resin used was acquired from the heat absorption peak in heat up using a differential scanning calorimeter (model: EXSTAR 6000, DSC 6200) manufactured by SEIKO. Further, regarding the value [M] of MFR at 260° C., the MELT INDEXER (model: L248-2531) manufactured by TECHNOL SEVEN Co., Ltd. was used, and a value measured at a loading of 2.16 kgf.

For imprint evaluations, an imprint device (VX-2000N-US) manufactured by SCIVAX was used, and the evaluations were carried out under condition described in the examples, respectively, using a mold of 30 mm by 30 mm. Table 1 shows imprint characteristics inherent to presence/absence of correlations (represented by equation 1) between a structure of a resin or a glass transition temperature Tg (° C.) and MFR at 260° C. For evaluation of imprint characteristics, acquired minute bumpy patterns were observed through an electronic microscope, and if a pattern similar to a mold was well transferred, a circular mark is filled, if a resin was filled in a pattern, but the resin adhered to a mold, and a deficit of a pattern was formed, then a triangle mark is filled, and if a pattern failure (insufficient filling, elongation, deficit) was confirmed, then a cross mark is filled.

First, an explanation will be given of the production method of an injection molded body used in the examples and comparative examples. Samples 1 to 6 were injection molded bodies made of resins which satisfied the foregoing equation 1, and samples 7 and 8 were injection molded bodies made of resins which did not satisfy the equation 1. Note that polymers used for injection molding contained an anti-oxidizing agent and a lubricant, as long as any particular explanations will be given for product examples.

Product Example 1

Production of Injection Molded Body Having Thickness of 2 mm

Ethylene/norbornene copolymer (Tg=135° C., MFR=41.4 @ 260° C.) was injection molded, and a transparent injection molded body (sample 1) having a thickness of 2 mm was produced (mold size: 10 cm by 10 cm by 2 mm, cylinder temperature: 260° C., and mold temperature: 120° C.).

Product Example 2

Production of Injection Molded Body Having Thickness of 2 mm

Ethylene/norbornene copolymer (Tg=109° C., MFR=39.9 @ 260° C.) was injection molded, and a transparent injection molded body (sample 2) having a thickness of 2 mm was produced (mold size: 10 cm by 10 cm by 2 mm, cylinder temperature: 230° C., and mold temperature: 95° C.).

Product Example 3

Production of Injection Molded Body Having Thickness of 2 mm

Ethylene/norbornene copolymer (Tg=106° C., MFR=72.8 @ 260° C.) was injection molded, and a transparent injection molded body (sample 3) having a thickness of 2 mm was produced (mold size: 10 cm by 10 cm by 2 mm, cylinder temperature: 230° C., and mold temperature: 90° C.).

Product Example 4

Production of Injection Molded Body Having Thickness of 2 mm

Ethylene/norbornene copolymer (Tg=138° C., MFR=60.1 @ 260° C.) was injection molded, and a transparent injection molded body (sample 4) having a thickness of 2 mm was produced (mold size: 10 cm by 10 cm by 2 mm, cylinder temperature: 260° C., and mold temperature: 120° C.).

Product Example 5

Production of Injection Molded Body Having Thickness of 2 mm

Ethylene/tetracyclododecene copolymer (Tg=135° C., MFR=37.5 @ 260° C.) was injection molded, and a transparent injection molded body (sample 5) having a thickness of 2 mm was produced (mold size: 10 cm by 10 cm by 2 mm, cylinder temperature: 260° C., and mold temperature: 120° C.).

Product Example 6

Production of Injection Molded Body Having Thickness of 2 mm

Hydrogeneration of cyclic-olefin based ring-opening polymer (Tg=100° C., MFR=45.8 @ 260° C.) was injection molded, and a transparent injection molded body (sample 6) having a thickness of 2 mm was produced (mold size: 10 cm by 10 cm by 2 mm, cylinder temperature: 220° C., and mold temperature: 85° C.).

Product Example 7

Production of Injection Molded Body Having Thickness of 2 mm

Ethylene/norbornene copolymer (Tg=135° C., MFR=9.6 @ 260° C.) was injection molded, and a transparent injection molded body (sample 7) having a thickness of 2 mm was produced (mold size: 10 cm by 10 cm by 2 mm, cylinder temperature: 260° C., and mold temperature: 120° C.).

Product Example 8

Production of Injection Molded Body Having Thickness of 2 mm

Hydrogeneration of cyclic-olefin based ring-opening polymer (Tg=138° C., MFR=7.7 @ 260° C.) was injection molded, and a transparent injection molded body (sample 8) having a thickness of 2 mm was produced (mold size: 10 cm by 10 cm by 2 mm, cylinder temperature: 260° C., and mold temperature: 120° C.).

Product Example 9

Production of Injection Molded Body Having Thickness of 1 mm

Ethylene/norbornene copolymer (Tg=132° C., MFR= 51.2 @ 260° C.) was injection molded, and a transparent injection molded body (sample 9) having a thickness of 1 mm was produced (mold size: 10 cm by 10 cm by 1 mm, cylinder temperature: 260° C., and mold temperature: 120° C.).

Product Example 10

Production of Injection Molded Body Having Thickness of 1 mm

Ethylene/norbornene copolymer (Tg=130° C., MFR= 12.0 @ 260° C.) was injection molded, and a transparent injection molded body (sample 10) having a thickness of 1 mm was produced (mold size: 10 cm by 10 cm by 1 mm, cylinder temperature: 260° C., and mold temperature: 120° C.).

Product Example 11

Production of Injection Molded Body Having Thickness of 2 mm

Ethylene/norbornene copolymer (Tg=135° C., MFR= 41.4 @ 260° C.) containing no additive was injection molded, and a transparent injection molded body (sample 11) having a thickness of 2 mm was produced (mold size: 10 cm by 10 cm by 1 mm, cylinder temperature: 260° C., and mold temperature: 120° C.).

Product Example 12

Production of Injection Molded Body Having Thickness of 2 mm

Ethylene/norbornene copolymer (Tg=135° C., MFR= 41.4 @ 260° C.) containing only an anti-oxidizing agent as an additive was injection molded, and a transparent injection molded body (sample 12) having a thickness of 2 mm was produced (mold size: 10 cm by 10 cm by 1 mm, cylinder temperature: 260° C., and mold temperature: 120° C.).

Example 1

Evaluation for Imprinting on Injection Molded Body

Sample 1 was fixed on a plate which was heated to a glass transition temperature Tg−18° C. (i.e., 117° C.), a mold (pattern: line/space (L/S)=1 μm/1 μm) which was preheated to a molding set temperature Tg+25° C. (i.e., 160° C.) was pressed against the surface of the resin substrate at a speed of 100 μm/second, and when the load sensor attached to the upper part of the mold reached 1000 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 2

Evaluation for Imprinting on Injection Molded Body)

Sample 1 was fixed on a plate which was heated to a glass transition temperature Tg−18° C. (i.e., 117° C.), a mold (pattern: L/S=1 μm/1 μm) which was preheated to a molding set temperature Tg+25° C. (i.e., 160° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 3

Evaluation for Imprinting on Injection Molded Body

Sample 1 was fixed on a plate which was heated to a glass transition temperature Tg−18° C. (i.e., 117° C.), a mold (pattern: L/S=1 μm/1 μm) which was preheated to a molding set temperature Tg+35° C. (i.e., 170° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1 and table 3.

Example 4

Evaluation for Imprinting on Injection Molded Body

Sample 1 was fixed on a plate which was heated to a glass transition temperature Tg−18° C. (i.e., 117° C.), a mold (pattern: L/S=1 μm/1 μm) which was preheated to a molding set temperature Tg+45° C. (i.e., 180° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 5

Evaluation for Imprinting on Injection Molded Body

Sample 1 was fixed on a plate which was heated to a glass transition temperature Tg−18° C. (i.e., 117° C.), a mold (pattern: hole, diameter 1 μm/depth 1 μm) which was preheated to a molding set temperature Tg+25° C. (i.e., 160° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 6

Evaluation for Imprinting on Injection Molded Body

Sample 1 was fixed on a plate which was heated to a glass transition temperature Tg−18° C. (i.e., 117° C.), a mold (pattern: hole, diameter 1 μm/depth 1 μm) which was preheated to a molding set temperature Tg+35° C. (i.e., 170° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 7

Evaluation for Imprinting on Injection Molded Body

Sample 1 was fixed on a plate which was heated to a glass transition temperature Tg−18° C. (i.e., 117° C.), a mold (pattern: hole, diameter 1 μm/depth 1 μm) which was preheated to a molding set temperature Tg+45° C. (i.e., 180° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 8

Evaluation for Imprinting on Injection Molded Body

Sample 1 was fixed on a plate which was heated to a glass transition temperature Tg−18° C. (i.e., 117° C.), a mold (pattern: pillar, diameter 0.5 μm/depth 1 μm) which was preheated to a molding set temperature Tg+25° C. (i.e., 160° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 9

Evaluation for Imprinting on Injection Molded Body

Sample 1 was fixed on a plate which was heated to a glass transition temperature Tg−18° C. (i.e., 117° C.), a mold (pattern: pillar, diameter 0.5 μm/depth 1 μm) which was preheated to a molding set temperature Tg+25° C. (i.e., 160° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 10

Evaluation for Imprinting on Injection Molded Body)

Sample 1 was fixed on a plate which was heated to a glass transition temperature Tg−18° C. (i.e., 117° C.), a mold (pattern: pillar, diameter 0.5 μm/depth 1 μm) which was preheated to a molding set temperature Tg+35° C. (i.e., 170° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 11

Evaluation for Imprinting on Injection Molded Body)

Sample 2 was fixed on a plate which was heated to a glass transition temperature Tg−18° C. (i.e., 91° C.), a mold (pattern: L/S=1 μm/1 μm) which was preheated to a molding set temperature Tg+35° C. (i.e., 144° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (91° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 12

Evaluation for Imprinting on Injection Molded Body

Sample 2 was fixed on a plate which was heated to a glass transition temperature Tg−18° C. (i.e., 91° C.), a mold (pattern: hole, diameter 1 μm/depth 1 μm) which was preheated to a molding set temperature Tg+35° C. (i.e., 144° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (91° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 13

Evaluation for Imprinting on Injection Molded Body

Sample 2 was fixed on a plate which was heated to a glass transition temperature Tg−18° C. (i.e., 91° C.), a mold (pattern: hole, diameter 1 μm/depth 1 μm) which was preheated to a molding set temperature Tg+35° C. (i.e., 144° C.) was pressed against the surface of the resin substrate at a speed of 100 μm/second, and when the load sensor attached to the upper part of the mold reached 500 N, it was held for 10 seconds by that load. Thereafter, it was cooled to Tg−18° C. (91° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 14

Evaluation for Imprinting on Injection Molded Body

Sample 2 was fixed on a plate which was heated to a glass transition temperature Tg−18° C. (i.e., 91° C.), a mold (pattern: pillar, diameter 0.5 μm/depth 1 μm) which was preheated to a molding set temperature Tg+35° C. (i.e., 144° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (91° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 15

Evaluation for Imprinting on Injection Molded Body

Sample 3 was fixed on a plate which was heated to a glass transition temperature Tg−18° C. (i.e., 88° C.), a mold (pattern: L/S=1 μm/1 μm) which was preheated to a molding set temperature Tg+25° C. (i.e., 131° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (88° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 16

Evaluation for Imprinting on Injection Molded Body

Sample 4 was fixed on a plate which was heated to a glass transition temperature Tg−18° C. (i.e., 120° C.), a mold (pattern: L/S=1 μm/1 μm) which was preheated to a molding set temperature Tg+35° C. (i.e., 173° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 17

Evaluation for Imprinting on Injection Molded Body

Sample 4 was fixed on a plate which was heated to a glass transition temperature Tg−18° C. (i.e., 120° C.), a mold (pattern: hole, diameter 1 μm/depth 1 μm) which was preheated to a molding set temperature Tg+35° C. (i.e., 173° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 18

Evaluation for Imprinting on Injection Molded Body

Sample 5 was fixed on a plate which was heated to a glass transition temperature Tg−18° C. (i.e., 117° C.), a mold (pattern: L/S=1 μm/1 μm) which was preheated to a molding set temperature Tg+45° C. (i.e., 180° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 19

Evaluation for Imprinting on Injection Molded Body

Sample 5 was fixed on a plate which was heated to a glass transition temperature Tg−18° C. (i.e., 117° C.), a mold (pattern: L/S=1 μm/1 μm) which was preheated to a molding set temperature Tg+35° C. (i.e., 170° C.) was pressed against the surface of the resin substrate at a speed of 100 μm/second, and when the load sensor attached to the upper part of the mold reached 500 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 20

Evaluation for Imprinting on Injection Molded Body

Sample 5 was fixed on a plate which was heated to a glass transition temperature Tg−18° C. (i.e., 117° C.), a mold (pattern: hole, diameter 1 μm/depth 1 μm) which was preheated to a molding set temperature Tg+45° C. (i.e., 180° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 21

Evaluation for Imprinting on Injection Molded Body

Sample 5 was fixed on a plate which was heated to a glass transition temperature Tg−18° C. (i.e., 117° C.), a mold (pattern: hole, diameter 1 μm/depth 1 μm) which was preheated to a molding set temperature Tg+35° C. (i.e., 170° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 22

Evaluation for Imprinting on Injection Molded Body

Sample 5 was fixed on a plate which was heated to a glass transition temperature Tg−18° C. (i.e., 117° C.), a mold (pattern: pillar, diameter 0.5 μm/depth 1 μm) which was preheated to a molding set temperature Tg+35° C. (i.e., 170° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 23

Evaluation for Imprinting on Injection Molded Body

Sample 6 was fixed on a plate which was heated to a glass transition temperature Tg−18° C. (i.e., 82° C.), a mold (pattern: L/S=1 μm/1 μm) which was preheated to a molding set temperature Tg+35° C. (i.e., 135° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (82° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 24

Evaluation for Imprinting on Injection Molded Body

Sample 6 was fixed on a plate which was heated to a glass transition temperature Tg−18° C. (i.e., 82° C.), a mold (pattern: hole, diameter 1 μm/depth 1 μm) which was preheated to a molding set temperature Tg+35° C. (i.e., 135° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (82° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 25

Evaluation for Imprinting on Injection Molded Body

Sample 6 was fixed on a plate which was heated to a glass transition temperature Tg−18° C. (i.e., 82° C.), a mold (pattern: hole, diameter 1 μm/depth 1 μm) which was preheated to a molding set temperature Tg+35° C. (i.e., 135° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (82° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 26

Evaluation for Imprinting on Injection Molded Body

Sample 6 was fixed on a plate which was heated to a glass transition temperature Tg−18° C. (i.e., 82° C.), a mold (pattern: pillar, diameter 0.5 μm/depth 1 μm) which was preheated to a molding set temperature Tg+35° C. (i.e., 135° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (82° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 27

Evaluation for Imprinting on Injection Molded Body

Sample 4 was fixed on a plate which was heated to a glass transition temperature Tg−18° C. (i.e., 120° C.), a mold (pattern: flow channel, width 50 μm/depth 50 μm) which was preheated to a molding set temperature Tg+32° C. (i.e., 170° C.) was pressed against the surface of the resin substrate at a speed of 1 μm/second, and when the load sensor attached to the upper part of the mold reached 500 N, it was held for 60 seconds by that load. Thereafter, it was cooled to Tg−18° C. (120° C.) while maintaining the displacement of the mold, and after the completion of cooling, the mold was released from the substrate at a speed of 1 μm/second. It was observed through an electronic microscope that a good pattern was transferred. The observation result is shown in table 1.

Example 28

Evaluation for Imprinting on Injection Molded Body

Sample 9 was fixed on a plate which was heated to a glass transition temperature Tg−18° C. (i.e., 114° C.), a mold (pattern: L/S=1 μm/1 μm) which was preheated to a molding set temperature Tg+35° C. (i.e., 167° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (114° C.) while maintaining the displacement of the mold, and after the completion of cooling, the mold was released from the substrate at a speed of 10 μm/second. It was observed through an electronic microscope that a good pattern was transferred. The observation result is shown in table 1.

Example 29

Evaluation for Imprinting on Injection Molded Body

Sample 9 was fixed on a plate which was heated to a glass transition temperature Tg−18° C. (i.e., 114° C.), a mold (pattern: hole, diameter 1 μm/depth 1 μm) which was preheated to a molding set temperature Tg+35° C. (i.e., 167° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (114° C.) while maintaining the displacement of the mold, and after the completion of cooling, the mold was released from the substrate at a speed of 10 μm/second. It was observed through an electronic microscope that a good pattern was transferred. The observation result is shown in table 2.

Example 30

Evaluation for Imprinting on Injection Molded Body

Sample 9 was fixed on a plate which was heated to a glass transition temperature Tg−18° C. (i.e., 114° C.), a mold (pattern: pillar, diameter 0.5 μm/depth 1 μm) which was preheated to a molding set temperature Tg+35° C. (i.e., 167° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (114° C.) while maintaining the displacement of the mold, and after the completion of cooling, the mold was released from the substrate at a speed of 10 μm/second. It was observed through an electronic microscope that a good pattern was transferred. The observation result is shown in table 1.

Comparative Example 1

Evaluation for Imprinting on Injection Molded Body

Sample 7 was fixed on a plate which was heated to a glass transition temperature Tg−18° C. (i.e., 117° C.), a mold (pattern: L/S=1 μm/1 μm) which was preheated to a molding set temperature Tg+25° C. (i.e., 160° C.) was pressed against the surface of the resin substrate at a speed of 100 μm/second, and when the load sensor attached to the upper part of the mold reached 1000 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 2

Evaluation for Imprinting on Injection Molded Body

Sample 7 was fixed on a plate which was heated to a glass transition temperature Tg−18° C. (i.e., 117° C.), a mold (pattern: L/S=1 μm/1 μm) which was preheated to a molding set temperature Tg+25° C. (i.e., 160° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 3

Evaluation for Imprinting on Injection Molded Body

Sample 7 was fixed on a plate which was heated to a glass transition temperature Tg−18° C. (i.e., 117° C.), a mold (pattern: L/S=1 μm/1 μm) which was preheated to a molding set temperature Tg+35° C. (i.e., 170° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1 and table 3.

Comparative Example 4

Evaluation for Imprinting on Injection Molded Body

Sample 7 was fixed on a plate which was heated to a glass transition temperature Tg−18° C. (i.e., 117° C.), a mold (pattern: L/S=1 μm/1 μm) which was preheated to a molding set temperature Tg+45° C. (i.e., 180° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 5

Evaluation for Imprinting on Injection Molded Body

Sample 7 was fixed on a plate which was heated to a glass transition temperature Tg−18° C. (i.e., 117° C.), a mold (pattern: hole, diameter 1 µm/depth 1 µm) which was preheated to a molding set temperature Tg+25° C. (i.e., 160° C.) was pressed against the surface of the resin substrate at a speed of 100 µm/second, and when the load sensor attached to the upper part of the mold reached 750 N, it was held for 10 seconds by that load. Thereafter, it was cooled to Tg−18° C. (117° C.) while maintaining the displacement of the mold, and after the completion of cooling, the mold was released from the substrate at a speed of 10 µm/second. It was observed through an electronic microscope that the resin was not filled in the pattern, so that the pattern was no good. The observation result is shown in table 1.

Comparative Example 6

Evaluation for Imprinting on Injection Molded Body

Sample 7 was fixed on a plate which was heated to a glass transition temperature Tg−18° C. (i.e., 117° C.), a mold (pattern: hole, diameter 1 µm/depth 1 µm) which was preheated to a molding set temperature Tg+35° C. (i.e., 170° C.) was pressed against the surface of the resin substrate at a speed of 100 µm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 µm/second. It was observed through an electronic microscope that the resin was not filled in the pattern, so that the pattern was no good. The observation result is shown in table 1.

Comparative Example 7

Evaluation for Imprinting on Injection Molded Body

Sample 7 was fixed on a plate which was heated to a glass transition temperature Tg−18° C. (i.e., 117° C.), a mold (pattern: hole, diameter 1 µm/depth 1 µm) which was preheated to a molding set temperature Tg+45° C. (i.e., 180° C.) was pressed against the surface of the resin substrate at a speed of 100 µm/second, and when the load sensor attached to the upper part of the mold reached 200 N, it was held for 10 seconds by that load. Thereafter, it was cooled to Tg−18° C. (117° C.) while maintaining the displacement of the mold, and after the completion of cooling, the mold was released from the substrate at a speed of 10 µm/second. It was observed through an electronic microscope that the resin was not filled in the pattern, so that the pattern was no good. The observation result is shown in table 1.

Comparative Example 8

Evaluation for Imprinting on Injection Molded Body

Sample 7 was fixed on a plate which was heated to a glass transition temperature Tg−18° C. (i.e., 117° C.), a mold (pattern: pillar, diameter 0.5 µm/depth 1 µm) which was preheated to a molding set temperature Tg+25° C. (i.e., 160° C.) was pressed against the surface of the resin substrate at a speed of 100 µm/second, and when the load sensor attached to the upper part of the mold reached 750 N, it was held for 10 seconds by that load. Thereafter, it was cooled to Tg−18° C. (117° C.) while maintaining the displacement of the mold, and after the completion of cooling, the mold was released from the substrate at a speed of 10 µm/second. It was observed through an electronic microscope that the resin was not filled in the pattern, so that the pattern was no good. The observation result is shown in table 1.

Comparative Example 9

Evaluation for Imprinting on Injection Molded Body

Sample 7 was fixed on a plate which was heated to a glass transition temperature Tg−18° C. (i.e., 117° C.), a mold (pattern: pillar, diameter 0.5 µm/depth 1 µm) which was preheated to a molding set temperature Tg+35° C. (i.e., 170° C.) was pressed against the surface of the resin substrate at a speed of 100 µm/second, and when the load sensor attached to the upper part of the mold reached 200 N, it was held for 10 seconds by that load. Thereafter, it was cooled to Tg−18° C. (117° C.) while maintaining the displacement of the mold, and after the completion of cooling, the mold was released from the substrate at a speed of 10 µm/second. It was observed through an electronic microscope that the resin was not filled in the pattern, so that the pattern was no good. The observation result is shown in table 1.

Comparative Example 10

Evaluation for Imprinting on Injection Molded Body

Sample 8 was fixed on a plate which was heated to a glass transition temperature Tg−18° C. (i.e., 120° C.), a mold (pattern: L/S=1 µm/1 µm) which was preheated to a molding set temperature Tg+25° C. (i.e., 163° C.) was pressed against the surface of the resin substrate at a speed of 100 µm/second, and when the load sensor attached to the upper part of the mold reached 750 N, it was held for 10 seconds by that load. Thereafter, it was cooled to Tg−18° C. (120° C.) while maintaining the displacement of the mold, and after the completion of cooling, the mold was released from the substrate at a speed of 10 µm/second. It was observed through an electronic microscope that the resin was not filled in the pattern, so that the pattern was no good. The observation result is shown in table 1.

Comparative Example 11

Evaluation for Imprinting on Injection Molded Body

Sample 8 was fixed on a plate which was heated to a glass transition temperature Tg−18° C. (i.e., 120° C.), a mold (pattern: L/S=1 µm/1 µm) which was preheated to a molding set temperature Tg+35° C. (i.e., 173° C.) was pressed against the surface of the resin substrate at a speed of 100 µm/second, and when the load sensor attached to the upper part of the mold reached 350 N, it was held for 10 seconds by that load. Thereafter, it was cooled to Tg−18° C. (120° C.) while maintaining the displacement of the mold, and after the completion of cooling, the mold was released from the substrate at a speed of 10 µm/second. It was observed through an electronic microscope that the resin was not filled in the pattern, so that the pattern was no good. The observation result is shown in table 1.

Comparative Example 12

Evaluation for Imprinting on Injection Molded Body

Sample 8 was fixed on a plate which was heated to a glass transition temperature Tg−18° C. (i.e., 120° C.), a mold (pattern: L/S=1 μm/1 μm) which was preheated to a molding set temperature Tg+45° C. (i.e., 183° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 13

Evaluation for Imprinting on Injection Molded Body

Sample 8 was fixed on a plate which was heated to a glass transition temperature Tg−18° C. (i.e., 120° C.), a mold (pattern: hole, diameter 1 μm/depth 1 μm) which was preheated to a molding set temperature Tg+25° C. (i.e., 163° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 14

Evaluation for Imprinting on Injection Molded Body

Sample 8 was fixed on a plate which was heated to a glass transition temperature Tg−18° C. (i.e., 120° C.), a mold (pattern: hole, diameter 1 μm/depth 1 μm) which was preheated to a molding set temperature Tg+35° C. (i.e., 173° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 15

Evaluation for Imprinting on Injection Molded Body

Sample 8 was fixed on a plate which was heated to a glass transition temperature Tg−18° C. (i.e., 120° C.), a mold (pattern: hole, diameter 1 μm/depth 1 μm) which was preheated to a molding set temperature Tg+45° C. (i.e., 183° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 16

Evaluation for Imprinting on Injection Molded Body

Sample 8 was fixed on a plate which was heated to a glass transition temperature Tg−18° C. (i.e., 120° C.), a mold (pattern: pillar, diameter 0.5 μm/depth 1 μm) which was preheated to a molding set temperature Tg+25° C. (i.e., 163° C.) was pressed against the surface of the resin substrate at a speed of 100 μm/second, and when the load sensor attached to the upper part of the mold reached 750 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 17

Evaluation for Imprinting on Injection Molded Body

Sample 8 was fixed on a plate which was heated to a glass transition temperature Tg−18° C. (i.e., 120° C.), a mold (pattern: pillar, diameter 0.5 μm/depth 1 μm) which was preheated to a molding set temperature Tg+35° C. (i.e., 173° C.) was pressed against the surface of the resin substrate at a speed of 100 μm/second, and when the load sensor attached to the upper part of the mold reached 200 N, it was held for 10 seconds by that load. Thereafter, it was cooled to Tg−18° C. (120° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 1.

Comparative Example 18

Evaluation for Imprinting on Injection Molded Body

Sample 8 was fixed on a plate which was heated to a glass transition temperature Tg−18° C. (i.e., 120° C.), a mold (pattern: flow channel, width 50 μm/depth 50 μm) which was preheated to a molding set temperature Tg+32° C. (i.e., 170° C.) was pressed against the surface of the resin substrate at a speed of 1 μm/second, and when the load sensor attached to the upper part of the mold reached 500 N, it was held for 60 seconds by that load. Thereafter, it was cooled to Tg−18° C. (120° C.) while maintaining the displacement of the mold, and after the completion of cooling, the mold was released from the substrate at a speed of 1 μm/second. It was observed through an electronic microscope that the resin was not filled in the pattern, so that the pattern was no good. The observation result is shown in table 1.

Comparative Example 19

Evaluation for Imprinting on Injection Molded Body

Sample 10 was fixed on a plate which was heated to a glass transition temperature Tg−18° C. (i.e., 112° C.), a mold (pattern: L/S=1 μm/1 μm) which was preheated to a molding set temperature Tg+35° C. (i.e., 165° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (112° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 2.

Comparative Example 20

Evaluation for Imprinting on Injection Molded Body

Sample 10 was fixed on a plate which was heated to a glass transition temperature Tg−18° C. (i.e., 112° C.), a mold (pattern: hole, diameter 1 μm/depth 1 μm) which was preheated to a molding set temperature Tg+35° C. (i.e., 165° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (112° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 2.

Comparative Example 21

Evaluation for Imprinting on Injection Molded Body

Sample 10 was fixed on a plate which was heated to a glass transition temperature Tg−18° C. (i.e., 112° C.), a mold (pattern: pillar, diameter 0.5 μm/depth 1 μm) which was preheated to a molding set temperature Tg+35° C. (i.e., 165° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (112° C.) while maintaining the displacement of the mold, and after the completion of cooling, the mold was released from the substrate at a speed of 10 μm/second. It was observed through an electronic microscope that the resin was not filled in the pattern, so that the pattern was no good. The observation result is shown in table 2.

Comparative Example 22

Evaluation for Imprinting on Injection Molded Body

Sample 11 was fixed on a plate which was heated to a glass transition temperature Tg−18° C. (i.e., 117° C.), a mold (pattern: L/S=1 μm/1 μm) which was preheated to a molding set temperature Tg+35° C. (i.e., 170° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that the pattern adhered to the mold, and had a deficit. The observation result is shown in table 3.

Comparative Example 23

Evaluation for Imprinting on Injection Molded Body

Sample 12 was fixed on a plate which was heated to a glass transition temperature Tg−18° C. (i.e., 117° C.), a mold (pattern: L/S=1 μm/1 μm) which was preheated to a molding set temperature Tg+35° C. (i.e., 170° C.) was pressed against the surface of the resin substrate at a speed of 100 μm/second, and when the load sensor attached to the upper part of the mold reached 350 N, it was held for 10 seconds by that load. Thereafter, it was cooled to Tg−18° C. (117° C.) while maintaining the displacement of the mold, and after the completion of cooling, the mold was released from the substrate at a speed of 10 μm/second. It was observed through an electronic microscope that the pattern adhered to the mold, and had a deficit. The observation result is shown in table 3.

TABLE 1

| | | MATERIAL | | | | | | | |
| --- | --- | --- | --- | --- | --- | --- | --- | --- | --- |
| PATTERN | LOAD (temperature) | SAMPLE 1 (Tg = 135° C.) | SAMPLE 2 (Tg = 109° C.) | SAMPLE 3 (Tg = 105° C.) | SAMPLE 4 (Tg = 138° C.) | SAMPLE 5 (Tg = 135° C.) | SAMPLE 6 (Tg = 100° C.) | SAMPLE 7 (Tg = 135° C.) | SAMPLE 8 (Tg = 133° C.) |
| L/S | 1000N (Tg + 25° C.) | ○ (EXAMPLE 1) | — | — | — | — | — | X (COMPARATIVE EXAMPLE 1) | — |
| | 750N (Tg + 25° C.) | ○ (EXAMPLE 2) | — | ○ (EXAMPLE 15) | — | — | — | X (COMPARATIVE EXAMPLE 2) | X (COMPARATIVE EXAMPLE 10) |
| | 350N (Tg + 35° C.) | ○ (EXAMPLE 3) | — | — | ○ (EXAMPLE 16) | — | — | X (COMPARATIVE EXAMPLE 3) | X (COMPARATIVE EXAMPLE 11) |
| | 200N (Tg + 45° C.) | ○ (EXAMPLE 4) | — | — | — | — | — | X (COMPARATIVE EXAMPLE 4) | X (COMPARATIVE EXAMPLE 12) |

TABLE 1-continued

| PATTERN | LOAD (temperature) | SAMPLE 1 (Tg = 135° C.) | SAMPLE 2 (Tg = 109° C.) | SAMPLE 3 (Tg = 105° C.) | SAMPLE 4 (Tg = 138° C.) | SAMPLE 5 (Tg = 135° C.) | SAMPLE 6 (Tg = 100° C.) | SAMPLE 7 (Tg = 135° C.) | SAMPLE 8 (Tg = 133° C.) |
|---|---|---|---|---|---|---|---|---|---|
| HOLE | 750N (Tg + 25° C.) | ○ (EXAMPLE 5) | — | — | — | — | — | X (COMPARATIVE EXAMPLE 5) | X (COMPARATIVE EXAMPLE 13) |
|  | 350N (Tg + 35° C.) | ○ (EXAMPLE 6) | — | — | ○ (EXAMPLE 17) | ○ (EXAMPLE 27) | — | X (COMPARATIVE EXAMPLE 6) | X (COMPARATIVE EXAMPLE 14) |
|  | 200N (Tg + 45° C.) | ○ (EXAMPLE 7) | — | — | — | ○ (EXAMPLE 20) | — | X (COMPARATIVE EXAMPLE 7) | X (COMPARATIVE EXAMPLE 15) |
| PILLAR | 1000N (Tg + 25° C.) | ○ (EXAMPLE 8) | — | — | — | — | — | — | — |
|  | 750N (Tg + 25° C.) | ○ (EXAMPLE 9) | — | — | — | — | — | X (COMPARATIVE EXAMPLE 8) | X (COMPARATIVE EXAMPLE 16) |
|  | 200N (Tg + 35° C.) | ○ (EXAMPLE 10) | — | — | — | — | — | X (COMPARATIVE EXAMPLE 9) | X (COMPARATIVE EXAMPLE 17) |
| L/S | 750N (Tg + 35° C.) | — | ○ (EXAMPLE 11) | — | — | — | ○ (EXAMPLE 23) | — | — |
|  | 500N (Tg + 35° C.) | — | — | — | — | ○ (EXAMPLE 19) | — | — | — |
|  | 350N (Tg + 45° C.) | — | — | — | — | ○ (EXAMPLE 18) | — | — | — |
| HOLE | 750N (Tg + 35° C.) | — | ○ (EXAMPLE 12) | — | — | — | ○ (EXAMPLE 24) | — | — |
|  | 500N (Tg + 35° C.) | — | ○ (EXAMPLE 13) | — | — | — | — | — | — |
|  | 350N (Tg + 35° C.) | — | — | — | — | — | ○ (EXAMPLE 25) | — | — |
| PILLAR | 750N (Tg + 35° C.) | — | ○ (EXAMPLE 14) | — | — | — | ○ (EXAMPLE 26) | — | — |
|  | 350N (Tg + 35° C.) | — | — | — | — | ○ (EXAMPLE 22) | — | — | — |
| FLOW CHANNEL | 500N (Tg + 32° C.) | — | — | — | ○ (EXAMPLE 27) | — | — | — | X (COMPARATIVE EXAMPLE 18) |

TABLE 2

| PATTERN | LOAD (temperature) | MATERIAL | |
|---|---|---|---|
| | | SAMPLE 9 (Tg = 132° C.) | SAMPLE 10 (Tg = 130° C.) |
| L/S | 350N (Tg + 35° C.) | O (EXAMPLE 28) | X (COMPARATIVE EXAMPLE 19) |
| HOLE | 350N (Tg + 35° C.) | O (EXAMPLE 29) | X (COMPARATIVE EXAMPLE 20) |
| PILLAR | 350N (Tg + 35° C.) | O (EXAMPLE 30) | X (COMPARATIVE EXAMPLE 21) |

TABLE 3

| PATTERN | LOAD (temperature) | MATERIAL (ADDITIVE) | | | |
|---|---|---|---|---|---|
| | | SAMPLE 1 (CONTAINING LUBRICANT AND ANTI-OXIDIZING AGENT) | SAMPLE 11 (NO ADDITIVE CONTAINED) | SAMPLE 12 (CONTAINING ONLY ANTI-OXIDIZING AGENT) | SAMPLE 7 (CONTAINING LUBRICANT AND ANTI-OXIDIZING AGENT) |
| L/S | 350N (Tg + 35° C.) | O (EXAMPLE 3) | Δ (COMPARATIVE EXAMPLE 22) | Δ (COMPARATIVE EXAMPLE 23) | X (COMPARATIVE EXAMPLE 3) |

L/S (Line/Space): 1 μm/1 μm
Hole: diameter 1 μm/depth 1 μm
Pillar: 0.5 μm/depth 1 μm
Flow channel: width 50 μm/depth 50 μm
Temperature of sample in molding: Tg−18° C.
Mold release temperature: Tg−18° C.

It becomes apparent from table 1 and table 2 that cyclic-olefin-based thermoplastic resin having a specific correlation (indicated by equation 1) between a glass transition temperature Tg (° C.) and MFR at 260° C. has a superior thermal imprint characteristic at a low temperature and a low pressure.

Furthermore, it becomes apparent from table 3 that in case of a cyclic-olefin-based thermoplastic resin 1 (sample 7) which does not have a specific correlation (indicated by equation 1) between a glass transition temperature Tg (° C.) and MFR at 260° C., a resin is not sufficiently filled in a pattern, and in case of a cyclic-olefin-based thermoplastic resin 2 (samples 11, 12) which has a specific correlation between a glass transition temperature Tg (° C.) and MFR at 260° C., and which has no lubricant added, a resin is filled in a pattern, but a pattern adheres to a mold, and may have a deficit, and in case of a cyclic-olefin-based thermoplastic resin 3 (sample 1) which has a specific correlation (indicated by equation 1) between a glass transition temperature Tg (° C.) and MFR at 260° C., and which has a lubricant added, the thermal imprint characteristic at a low temperature and a low pressure is superior. Therefore, a lubricant improves the mold release characteristic after imprint, and improves the productivity (throughput) of an imprint product.

It is again emphasized that the above-described embodiments of the present invention, particularly, any "preferred" embodiments, are possible examples of implementations merely set forth for a clear understanding of the principles of the invention. Many variations and modifications may be made to the above-described embodiments of the invention without substantially departing from the spirit and principles of the invention. All such modifications are intended to be included herein within the spirit of the invention and the scope of protection is only limited by the accompanying claims.

The invention claimed is:

1. A thermal imprint method comprising:
pressing a mold, which is heated to a temperature less than or equal to a glass transition temperature Tg (° C.) of a resin for thermal imprint +45° C., against an injection molded body having a thickness of greater than or equal to 1 mm and comprising the resin for thermal imprint, thereby transferring a micrometer or nanometer-scale pattern of the mold, wherein the resin for thermal imprint comprises:

a cyclic-olefin-based thermoplastic resin that contains at least one skeleton, represented by a chemical equation 2, in a main chain, wherein a glass transition temperature Tg (° C.) of the resin and a value [M] of MFR at 260° C. satisfy an equation 1; and [M]>20;
wherein the chemical equation 2 is represented by:

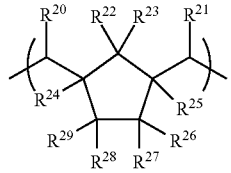

and the equation 1 is:

$Tg(° C.) < 219 \times \log [M] - 104$;

and further, wherein $R^{20}$ to $R^{29}$ in chemical equation 2 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another; and,
wherein [M] in equation 1 represents a value of MFR at 260° C.

2. A thermal imprint method comprising steps of:
pressing a mold against an injection molded body having a thickness of greater than or equal to 1 mm and comprising a resin for thermal imprint, thereby transferring a micrometer or nanometer-scale pattern of the mold; and
releasing the mold from the resin for thermal imprint at a temperature greater than or equal to a glass transition temperature (Tg) of the resin for thermal imprint −25° C., wherein the resin for thermal imprint comprises:
a cyclic-olefin-based thermoplastic resin that contains at least one skeleton, represented by a chemical equation 2, in a main chain,
wherein a glass transition temperature Tg (° C.) of the resin and a value [M] of MFR at 260° C. satisfy an equation 1; and [M] >20;

wherein the chemical equation 2 is represented by:

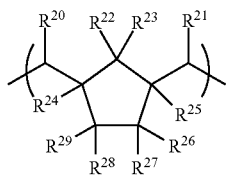

and the equation 1 is:

$Tg(° C.) < 219 \times \log [M] - 104$;

and further, wherein $R^{20}$ to $R^{29}$ in chemical equation 2 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another; and, wherein [M] in equation 1 represents a value of MFR at 260° C.

3. A thermal imprint method comprising:

pressing a mold against an injection molded body having a thickness of greater than or equal to 1 mm and comprising a resin for thermal imprint, at less than or equal to 1.2 MPa, thereby transferring a micrometer or nanometer-scale pattern of the mold, wherein the resin for thermal imprint comprises:

a cyclic-olefin-based thermoplastic resin that contains at least one skeleton, represented by a chemical equation 2, in a main chain, wherein a glass transition temperature Tg (° C.) of the resin and a value [M] of MFR at 260° C. satisfy an equation 1; and [M] >20;

wherein the chemical equation 2 is represented by:

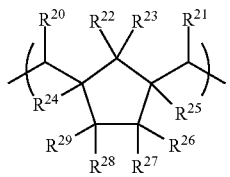

and the equation 1 is:

$Tg(° C.) < 219 \times \log [M] - 104$;

and further, wherein $R^{20}$ to $R^{29}$ in chemical equation 2 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another; and, wherein [M] in equation 1 represents a value of MFR at 260° C.

4. A method of using a cyclic-olefin-based thermoplastic resin for an imprint process, comprising the steps of:

producing an injection molded body having a thickness of greater than or equal to 1 mm and containing a cyclic-olefin-based thermoplastic resin having at least one skeleton represented by a chemical equation 8 in a main chain, and wherein:

a glass transition temperature Tg (° C.) of the cyclic-olefin-based thermoplastic resin a value ([M]) of MFR at 260° C. satisfy a equation 1; and [M]>20, wherein the chemical equation 8 is represented by:

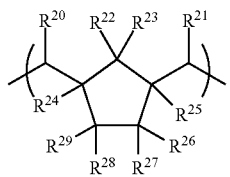

and the equation 1 is:

$Tg(° C.) < 219 \times \log [M] - 104$;

and further wherein $R^{20}$ to $R^{29}$ in chemical equation 8 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another;

wherein [M] in equation 1 represents a value of MFR at 260° C.; and pressing the mold against an injection molded body, thereby transferring a micrometer or nanometer-scale pattern of the mold.

5. A thermal imprint method comprising:

pressing a mold, which is heated to a temperature less than or equal to a glass transition temperature Tg (° C.) of a resin for thermal imprint +45° C., against an injection molded body having a thickness of greater than or equal to 1 mm and comprising the resin for thermal imprint, thereby transferring a micrometer or nanometer-scale pattern of the mold, wherein the resin for thermal imprint comprises:

a cyclic-olefin-based thermoplastic resin that contains at least one skeleton, represented by a chemical equation 2, in a main chain, wherein the cyclic-olefin-based thermoplastic resin is a hydrogenation of cyclic-olefin-based ring-opening polymer, wherein a glass transition temperature Tg (° C.) of the resin and a value [M] of MFR at 260° C. satisfy an equation 1; and [M]>20;

wherein the chemical equation 2 is represented by:

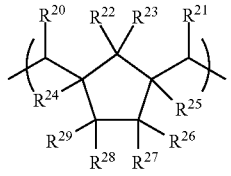

and the equation 1 is:

$Tg(° C.) < 219 \times \log [M] - 104$;

and further, wherein $R^{20}$ to $R^{29}$ in chemical equation 2 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another; and, wherein [M] in equation 1 represents a value of MFR at 260° C.

6. A thermal imprint method comprising steps of:

pressing a mold against an injection molded body having a thickness of greater than or equal to 1 mm and comprising a resin for thermal imprint, thereby transferring a micrometer or nanometer-scale pattern of the mold; and releasing the mold from the resin for thermal imprint at a temperature greater than or equal to a glass transition temperature (Tg) of the resin for thermal imprint $-25°$ C., wherein the resin for thermal imprint comprises:

a cyclic-olefin-based thermoplastic resin that contains at least one skeleton, represented by a chemical equation 2, in a main chain, wherein the cyclic-olefin-based thermoplastic resin is a hydrogenation of cyclic-olefin-based ring-opening polymer, wherein a glass transition temperature Tg (° C.) of the resin and a value [M] of MFR at 260° C. satisfy an equation 1; and [M] >20;

wherein the chemical equation 2 is represented by:

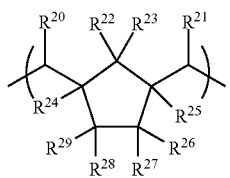

and the equation 1 is:

$Tg(° C.) < 219 \times \log [M] - 104;$ and further, wherein $R^{20}$ to $R^{29}$ in chemical equation 2 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another; and, wherein [M] in equation 1 represents a value of MFR at 260° C.

7. A thermal imprint method comprising:

pressing a mold against an injection molded body having a thickness of greater than or equal to 1 mm and comprising a resin for thermal imprint, at less than or equal to 1.2 MPa, thereby transferring a micrometer or nanometer-scale pattern of the mold, wherein the resin for thermal imprint comprises:

a cyclic-olefin-based thermoplastic resin that contains at least one skeleton, represented by a chemical equation 2, in a main chain, wherein the cyclic-olefin-based thermoplastic resin is a hydrogenation of cyclic-olefin-based ring-opening polymer, wherein a glass transition temperature Tg (° C.) of the resin and a value [M] of MFR at 260° C. satisfy an equation 1; and [M]>20;

and wherein the chemical equation 2 is represented by:

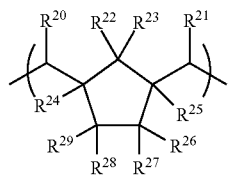

and the equation 1 is:

$Tg(° C.) < 219 \times \log [M] - 104;$ and further, wherein $R^{20}$ to $R^{29}$ in chemical equation 2 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another; and, wherein [M] in equation 1 represents a value of MFR at 260° C.

8. A method of using a cyclic-olefin-based thermoplastic resin for an imprint process, comprising the steps of:

producing an injection molded body having a thickness of greater than or equal to 1 mm and containing a cyclic-olefin-based thermoplastic resin having at least one skeleton represented by a chemical equation 8 in a main chain, wherein the cyclic-olefin-based thermoplastic resin is a hydrogenation of cyclic-olefin-based ring-opening polymer, wherein a glass transition temperature Tg (° C.) of the cyclic-olefin-based thermoplastic resin and a value ([M]) of MFR at 260° C. satisfy a equation 1; and [M]>20, wherein the chemical equation 8 is represented by:

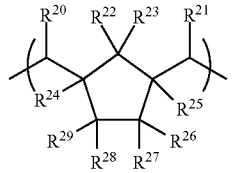

and the equation 1 is:

$Tg(° C.) < 219 \times \log [M] - 104;$ and further wherein $R^{20}$ to $R^{29}$ in chemical equation 8 may differ or may be same, each of which is a substituent containing a hydrogen atom, a deuterium atom, a hydrocarbon radical having a carbon number of 1 to 15, a halogen atom, or a hetero atom of oxygen or sulfur, and may form a monocyclic or polycyclic structure with one another; and, wherein [M] in equation 1 represents a value of MFR at 260° C.; and pressing the mold against the injection molded body, thereby transferring a micrometer or nanometer-scale pattern of the mold.

* * * * *

UNITED STATES PATENT AND TRADEMARK OFFICE
CERTIFICATE OF CORRECTION

PATENT NO. : 8,721,950 B2  
APPLICATION NO. : 13/666339  
DATED : May 13, 2014  
INVENTOR(S) : Takemori Toshifumi et al.

Page 1 of 1

It is certified that error appears in the above-identified patent and that said Letters Patent is hereby corrected as shown below:

On the title page, at (30) Foreign Application Priority Data:

Application Number "2005-357014" should read --2005-280802--.

Signed and Sealed this  
Fifteenth Day of December, 2015

Michelle K. Lee  
*Director of the United States Patent and Trademark Office*